United States Patent
Yin et al.

(10) Patent No.: US 9,281,308 B2
(45) Date of Patent: Mar. 8, 2016

(54) METHOD TO TUNE NARROW WIDTH EFFECT WITH RAISED S/D STRUCTURE

(71) Applicant: Globalfoundries Singapore PTE. LTD., Singapore (SG)

(72) Inventors: Chunshan Yin, Singapore (SG); Guangyu Huang, Singapore (SG); Elgin Quek, Singapore (SG); Jae Gon Lee, Singapore (SG); Kian Ming Tan, Singapore (SG)

(73) Assignee: Globalfoundries Singapore Pte., Ltd., Singapore (SG)

( * ) Notice: Subject to any disclaimer, the term of this patent is extended or adjusted under 35 U.S.C. 154(b) by 0 days.

(21) Appl. No.: 14/338,012

(22) Filed: Jul. 22, 2014

(65) Prior Publication Data
US 2014/0332902 A1  Nov. 13, 2014

Related U.S. Application Data

(63) Continuation of application No. 12/803,754, filed on Jul. 6, 2010, now Pat. No. 8,785,287.

(51) Int. Cl.

| | |
|---|---|
| *H01L 29/10* | (2006.01) |
| *H01L 27/088* | (2006.01) |
| *H01L 21/265* | (2006.01) |
| *H01L 29/08* | (2006.01) |
| *H01L 29/417* | (2006.01) |
| *H01L 29/66* | (2006.01) |
| *H01L 21/336* | (2006.01) |
| *H01L 29/78* | (2006.01) |

(52) U.S. Cl.
CPC ........ *H01L 27/088* (2013.01); *H01L 21/26586* (2013.01); *H01L 29/0847* (2013.01); *H01L 29/1033* (2013.01); *H01L 29/1045* (2013.01); *H01L 29/41783* (2013.01); *H01L 29/6659* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 6,160,299 A | 12/2000 | Rodder | |
| 6,518,135 B1 | 2/2003 | Ahn | |
| 6,555,437 B1* | 4/2003 | Yu | 438/300 |
| 7,145,191 B1* | 12/2006 | Teng | H01L 21/823807 |
| | | | 257/288 |
| 2007/0287239 A1 | 12/2007 | Yoon et al. | |
| 2009/0197382 A1* | 8/2009 | Anderson | H01L 21/26513 |
| | | | 438/283 |

* cited by examiner

*Primary Examiner* — Johannes P Mondt
(74) *Attorney, Agent, or Firm* — Robert D. McCutcheon

(57) ABSTRACT

A method (and semiconductor device) of fabricating a semiconductor device adjusts gate threshold (Vt) of a field effect transistor (FET) with raised source/drain (S/D) regions. A halo region is formed in a two-step process that includes implanting dopants using conventional implantation techniques and implanting dopants at a specific twist angle. The dopant concentration in the halo region near the active edge of the raised S/D regions is higher and extends deeper than the dopant concentration within the interior region of the raised S/D regions. As a result, Vt near the active edge region is adjusted and different from the Vt at the active center regions, thereby achieving same or similar Vt for a FET with different width.

20 Claims, 8 Drawing Sheets

METHOD TO TUNE NARROW WIDTH EFFECT WITH RAISED S/D STRUCTURE

CROSS-REFERENCE TO RELATED APPLICATION(S)

This application is a continuation of U.S. patent application Ser. No. 12/803,754 filed Jul. 6, 2010 entitled "NOVEL METHOD TO TUNE NARROW WIDTH EFFECT WITH RAISED S/D STRUCTURE." U.S. patent application Ser. No. 12/803,754 is assigned to the assignee of the present application and is incorporated by reference into this disclosure as if fully set forth herein. This disclosure hereby claims priority under 35 U.S.C. §120 to U.S. patent application Ser. No. 12/803,754.

TECHNICAL FIELD

The present disclosure relates generally to devices and methods of fabrication of semiconductor devices, and more particularly to the fabrication of field-effect transistors (FETs) having raised source/drain (S/D) regions for threshold voltage (Vt) adjustment.

BACKGROUND

FIGS. 1A and 1B illustrate a basic representation of a conventional field-effect transistor (FET) structure 100 in the prior art. The FET 100 includes two source/drain (S/D) regions 110, 120 (of a first conductivity type) formed on or in a substrate 130 (of a second conductivity type). A shallow trench isolation (STI) structure 140 isolates the FET 100 from other devices (not shown) formed on or in the substrate 130. A gate structure 150 overlies a portion of the substrate 130 and substantially defines a channel between one S/D region to the other. The "width" of the FET 100 is shown (FIGS. 1A, 1B) as extending along the longer dimension of the gate 150 (generally perpendicular to the flow of carrier(s) between the S/D regions.

Now referring to FIG. 1C, there is shown a graph depicting transistor gate width versus threshold voltage (Vt). As shown, Vt decreases as the gate width decreases. This is referred to as the narrow width effect. This presents a problem in nano-scale MOSFET devices and their design. As devices are scaled down, the narrowing of the gate width decreases Vt (assuming all other variables are unchanged). It will be understood that when devices are scaled, it may be possible that Vt increases, but in most scaling, it decreases. The decrease in Vt is caused by a combination of factors, including gate oxide thinning effect, doping depletion effect, gate wrap effect, stress effect, etc.

Prior art methods aimed at controlling the narrow width effect (i.e., increasing Vt) have focused on STI module optimization, but these methods have drawbacks—they are not straightforward, only minimally increase Vt, and are limited by reliability, tool availability and STI sharing among different applications.

Leading edge technologies used in fabricating nano-scale technologies commonly use raised S/D regions/structures in order to reduce S/D junction depth while maintaining or even reducing series resistance. Stress enhancement technologies, such as eSiGe for PFETs and SiC for NFETs can be used to form raised S/D regions.

Accordingly, there is a need for an improved fabrication process (and resulting devices) that increases the gate Vt of small scale FETs. By increasing the Vt of a narrow width devices while maintaining the Vt of nominal width devices, the narrow width effect can be minimized and FETs can be fabricated with smaller width dimensions with little or no decrease in Vt. Additionally, an improved fabrication process is needed to enable control (e.g., tune) of gate Vt in FETs. Such improved processes may be used in FETs with raised S/D regions.

SUMMARY

In accordance with one embodiment, there is provided a method of forming a semiconductor device. The method includes providing a substrate of a first conductivity type and forming thereon a field effect transistor (FET) structure including a gate, a first raised source/drain (S/D) region and a second raised S/D region, wherein the first and second raised S/D regions of a second conductivity type. A first halo region is formed by implanting dopants of the first conductivity type within the substrate such that a doping concentration at a given depth below a channel surface near a center of the first raised S/D region is lower than a doping concentration at the given depth below the channel surface near an edge of the first raised S/D region.

In accordance with another embodiment, there is provided a method of forming a field-effect transistor (FET) for increasing the gate threshold of the FET. The method includes providing a substrate of a first conductivity type and forming thereon a field effect transistor (FET) structure including a gate, a first raised source/drain (S/D) region and a second raised S/D region, wherein the first and second raised S/D regions of a second conductivity type. Dopants of the first conductivity type are implanted at a predetermined tilt angle within the substrate to form a first intermediate halo region, and dopants of the first conductivity type are implanted at a predetermined twist angle of between about 20 and 70 degrees to form a final halo region including the intermediate halo region.

In yet another embodiment, there is provided a semiconductor device including a substrate of a first conductivity type defining a channel surface, a gate structure having a dielectric layer and a gate electrode disposed on the substrate, and a first raised source/drain (S/D) region and a second raised S/D region having a channel formed beneath the gate structure, the first and second raised S/D regions of a second conductivity type. A halo region having dopants of the first conductivity type extends along at least a portion of the gate structure from one edge of the first raised S/D region to another edge of the first raised S/D region. The doping concentration in the halo region near a center region of the first raised S/D region at a given depth below the channel surface is lower than a doping concentration in the halo region near an edge of the first raised S/D region at the given depth, such that the FET has a gate threshold (Vt) near the center region that is lower than a Vt near the edge of the first raised S/D region.

Other technical features may be readily apparent to one skilled in the art from the following figures, descriptions, and claims.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1A:
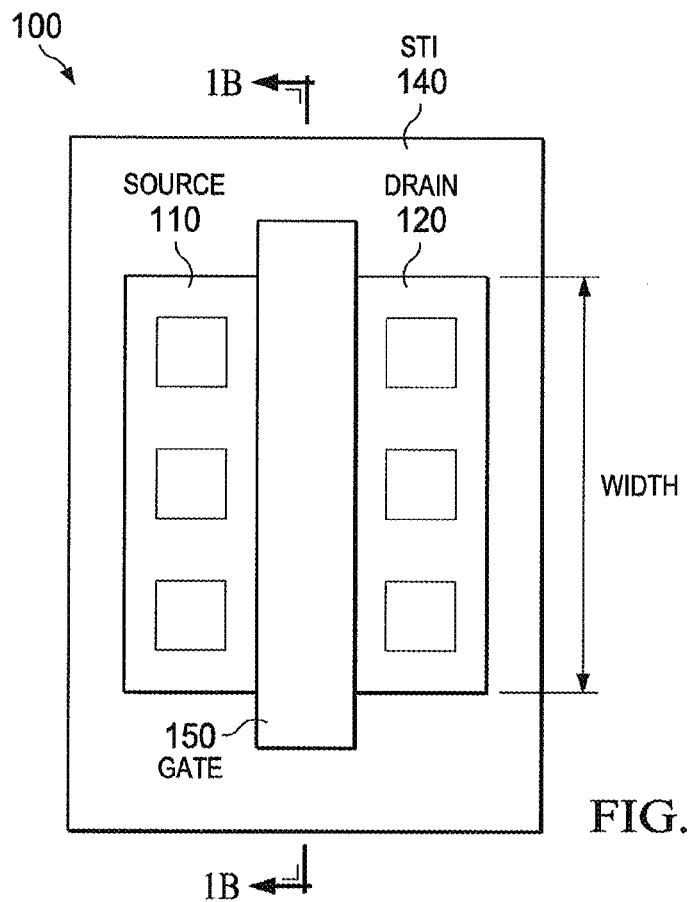
FIGS. 1A and 1B are a top view and cross-sectional view, respectively, illustrating a typical configuration of a prior art FET (S/D regions, gate structure) with shallow trench isolation.
Figure 1B:
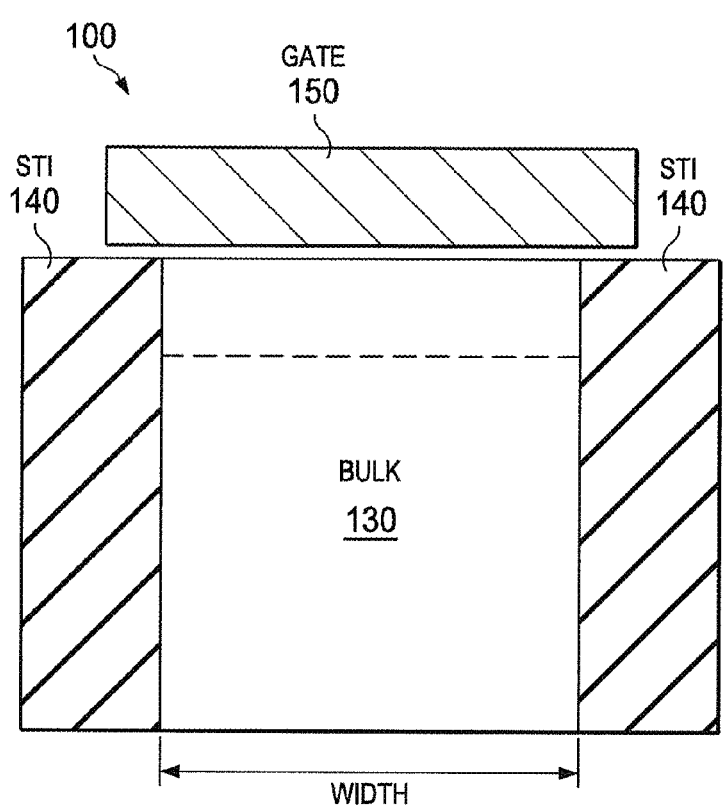
Figure 1C:
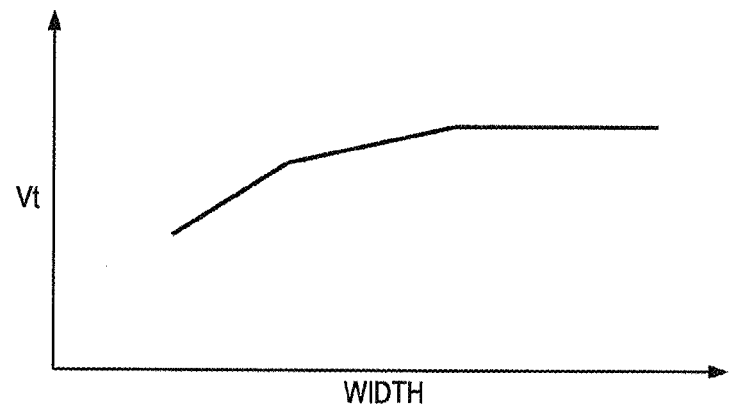
FIG. 1C is a graph depicting gate threshold (Vt) versus gate width.
Figure 2:
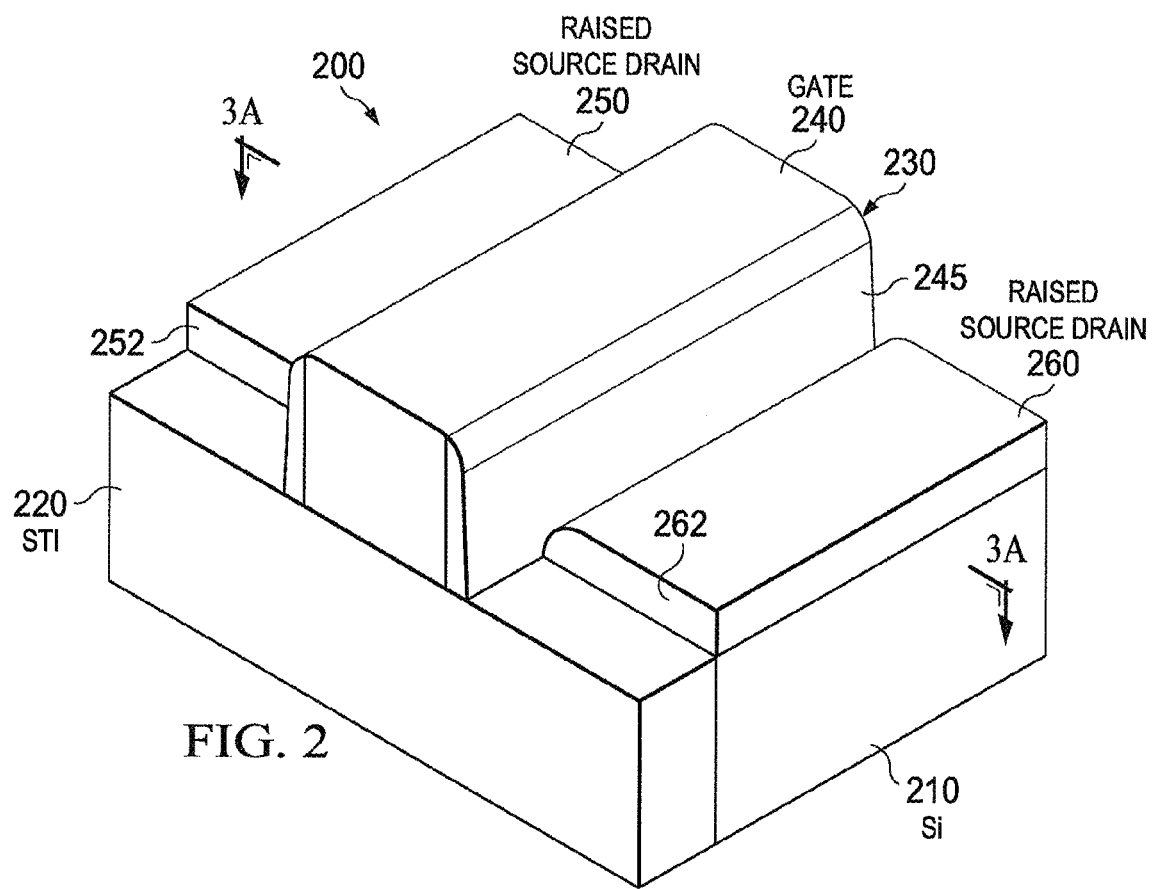
FIG. 2 is a perspective view of a field-effect transistor (FET) structure in accordance with the present disclosure.

Referring to FIG. 2, there is depicted a perspective view of a field-effect transistor (FET) structure 200 in accordance with the present disclosure. The FET 200 is shown formed on (or in) a portion of silicon substrate 210 between a shallow trench isolation (STI) region 220. The FET structure 200 includes a gate stack (or gate) 230 having a gate dielectric (not shown), a gate electrode 240 and sidewall spacers 245. Two regions 250, 260 having dopants of a first conductivity type form the source/drain (S/D) regions, while the silicon substrate 210 has dopants of a second conductivity type. It will be understood the FET structure 200 may be a p-type or n-type FET, and that additional FETs and other structures (not shown) may be formed in or on the substrate 210.

As shown, the gate 230 extends laterally (substantially perpendicular) beyond active edges 252, 262 of the S/D regions 250, 260. Though not shown, the gate 230 additional extends laterally beyond the other active edges of the S/D regions, 260 at the far end of the FET 200. In the embodiment shown, the active edges of the S/D regions 250, 260 are shown substantially perpendicular to the channel surface (e.g., the silicon substrate 210), however, the teachings of the present disclosure may also apply to edges that are not perpendicular (or substantially perpendicular) to the channel surface. The S/D regions 250, 260 are shown as raised S/D regions, and the FET structure 200 can be formed in accordance with prior art or conventional processing techniques utilized to form FETs with raised S/D regions.

Substrate 210 may include, for example, silicon, silicon-on-insulator (SOI), or other suitable semiconductor substrate materials, now known or later developed. The substrate 210 may include silicon (e.g., n-type, p-type, or no type) provided in a single well or twin-well process, and the STI may be formed according to known or later developed processes.

Both S/D regions 250, 260 may be p-type or both may be n-type (depending on the channel type of FET desired). For example, the S/D regions 250 260 may be formed of silicon-germanium (SiGe) and doped with p-type impurities (e.g., boron) to form a pFET, or may be formed of silicon-carbide (SiC) and doped with n-type impurities (e.g., arsenic (As)) to form an nFET. For purposes of this disclosure, any description hereinafter will be with reference to a p-type FET. The FET structure 200 was formed in accordance with the method or process more fully described below. It may be possible that methods or process other than as described below may be utilized to form the FET structure 200.

Figure 3A:
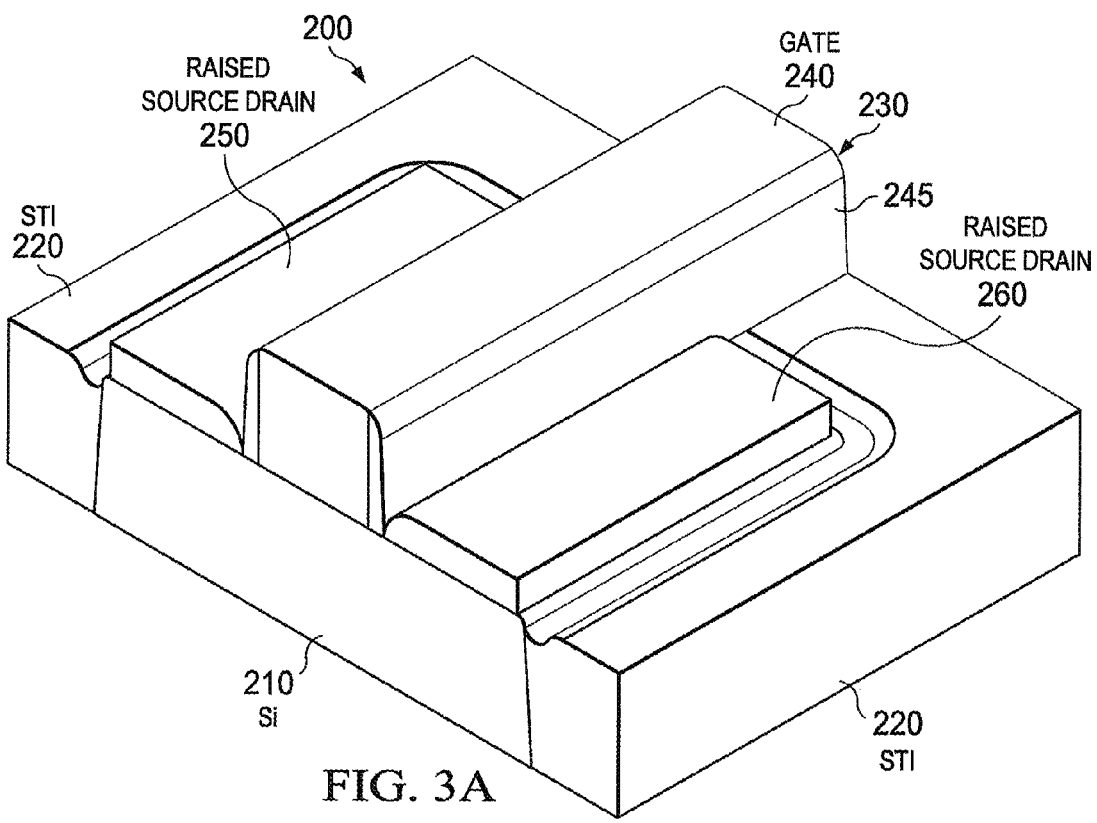
FIGS. 3A and 3B are three-dimensional views showing cross-sections of the FET from different viewpoints.
Figure 3B:
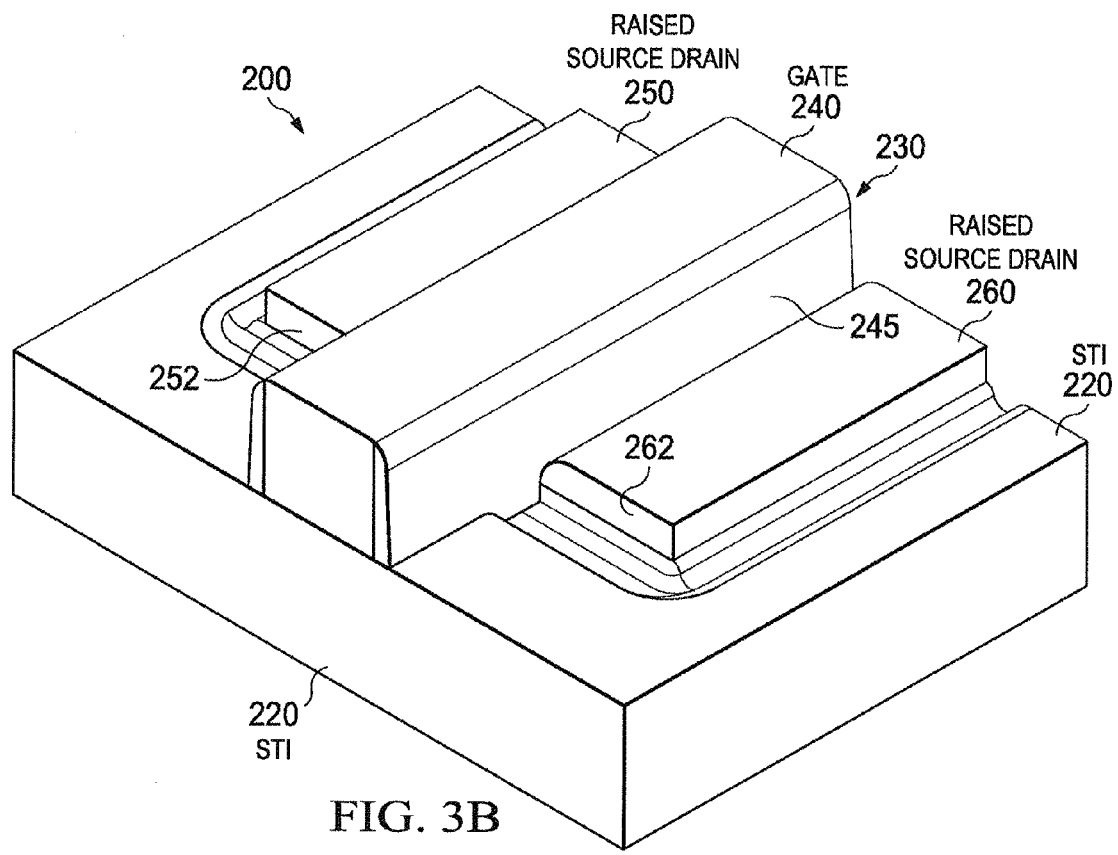

Now turning to FIGS. 3A and 3B, there are illustrated three-dimensional views showing cross-sections of the FET 200 from different viewpoints. FIG. 3A provides a cross-sectional view along line 3A-3A (shown in FIG. 2), while FIG. 3B provides a view from the one end of the FET 200 (the view from the other end would be similar).

In general terms, the present disclosure is directed to increasing the gate threshold (Vt) along the edges 252, 262 of the active S/D regions 250, 260. This is accomplished by implanting a novel halo region within the silicon substrate 210 resulting in an increase in Vt for the FET 200. As will be appreciated, conventional fabrication of raised S/D transistors may (or may not) include the formation of extension regions (shallow junction extensions) underneath the gate and halo regions in the silicon substrate channel region. These shallow but heavily doped extension regions are formed of the same conductivity type as the S/D regions 250, 260. Known halo regions are thin, heavily doped regions formed (usually by implantation) in the silicon substrate 210 close to the junction walls of the S/D regions 250, 260. These known halo regions are formed of the same conductivity type as the channel substrate 210 (i.e., opposite conductivity type of the S/D regions). While the shallow extension regions and halo regions work to increase Vt and reduce channel length modulation effects, this is generally not enough to overcome reduction in Vt caused by a significant reduction in transistor gate width.

The teachings herein can also be used to adjust Vt lower by adjusting the Vt at the edges of the active region. In such embodiment, the same implantation process with twist angle can be utilized, but the implanted dopants have a conductivity type that is the same as the raised S/D regions (instead of the same as the channel).

The present teachings introduce extra dopants around the active edge 252, 262 so that Vt at the edge area may be increased and/or separately adjustable. As a result, narrow width MOSFETs can achieve the same or similar Vt as those of wider width MOSFETs.

Figure 4A:
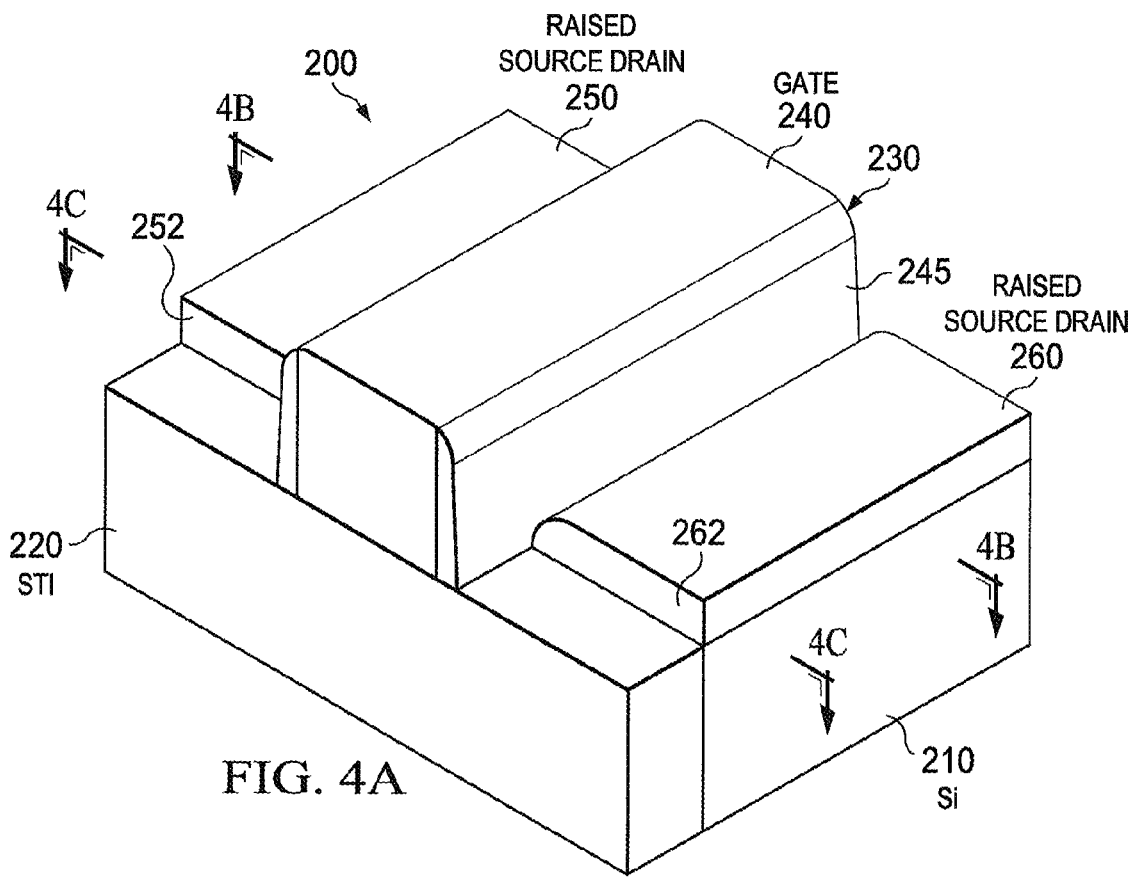
FIGS. 4A, 4B and 4C provide a three-dimensional perspective view, cross-sectional view along line 4B-4B, and a cross-sectional view along line 4C-4C, respectively, of the FET shown in FIG. 2.
Figure 4C:
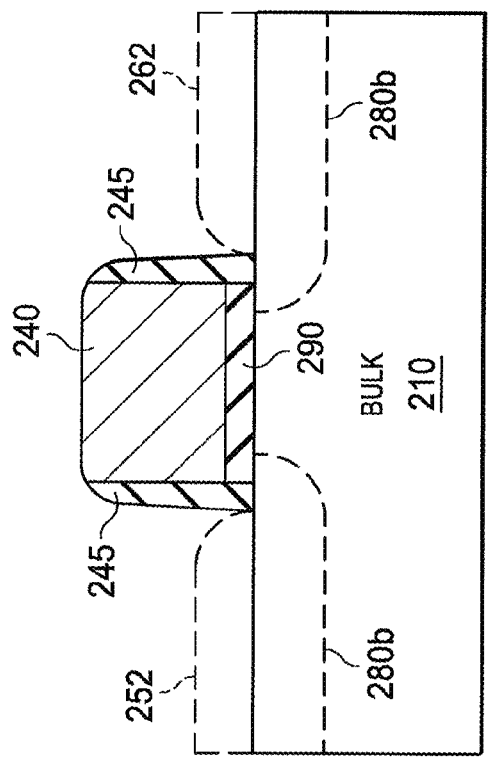
Figure 4B:
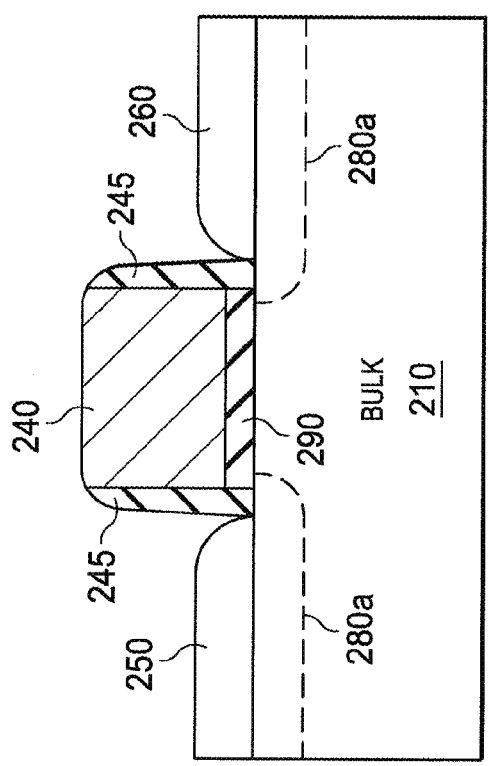

Now turning to FIGS. 4A, 4B and 4C, there is shown a three-dimensional perspective view, cross-sectional view along line 4B-4B, and a cross-sectional view along line 4C-4C, respectively, of the FET 200 in accordance with the present disclosure. FIG. 4B provides a cross-sectional view near the center of the S/D regions, while FIG. 4C provides a cross-sectional view near the active edge (i.e., end view at active edge).

With reference to FIGS. 4B and 4C, a halo region 280 (shown in dotted lines) is formed within the substrate 210. At different points along the gate width, the halo profile is different. Near the center (FIG. 4B) the halo region 280a is shallower, while at the edge (FIG. 4C) the halo region 280b is deeper (with respect to the channel surface 290). In addition, the halo region 280b extends further than the halo region 280a laterally under the sidewall spacers 245. As a result, around the active edge area 252, 262 (of the S/D regions) the Vt is higher than near the center. This increases the overall Vt of the device, but the amount of Vt increase is more for a narrow-width device than that of a wide-width device. As will be appreciated, conventional techniques of halo region formation will create the same or substantially uniform profile along the entire width of the structure. That is, the doping profile will be the same (or substantially the same) at the center and at the active edge. This is because the prior art conventional technique for forming conventional halo regions generally utilizes a tilt angle and a twist that has no effect (zero, 90, 180, 270 degrees). A short description of tilt and twist is provided below with reference to FIGS. 5A and 5B.

Figure 5A:
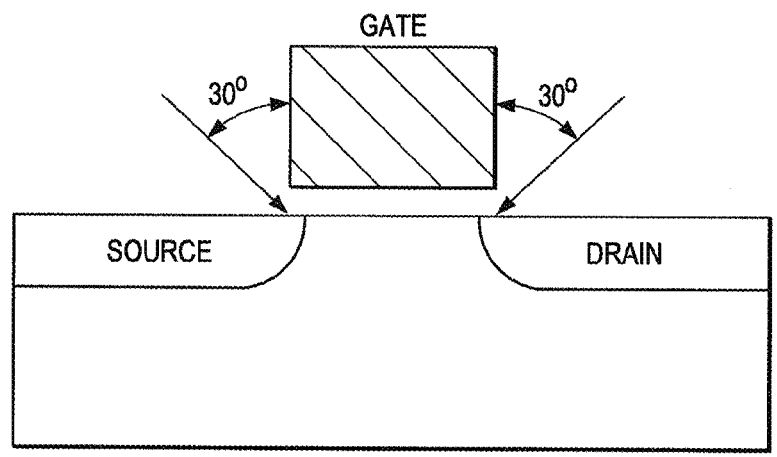
FIGS. 5A and 5B illustrate implantation tilt angle and twist angle, respectively.

Turning to FIG. 5A, there is shown a conventional FET cross-section showing the S/D regions, channel, and gate. Tilt refers to the angle of implantation of dopants with respect to a right angle to the substrate surface. For example, a zero degree tilt is perpendicular (right angle) to the substrate surface while a 30 degree tilt is measured using the perpendicular as zero degrees. See, FIG. 5A.

Figure 5B:
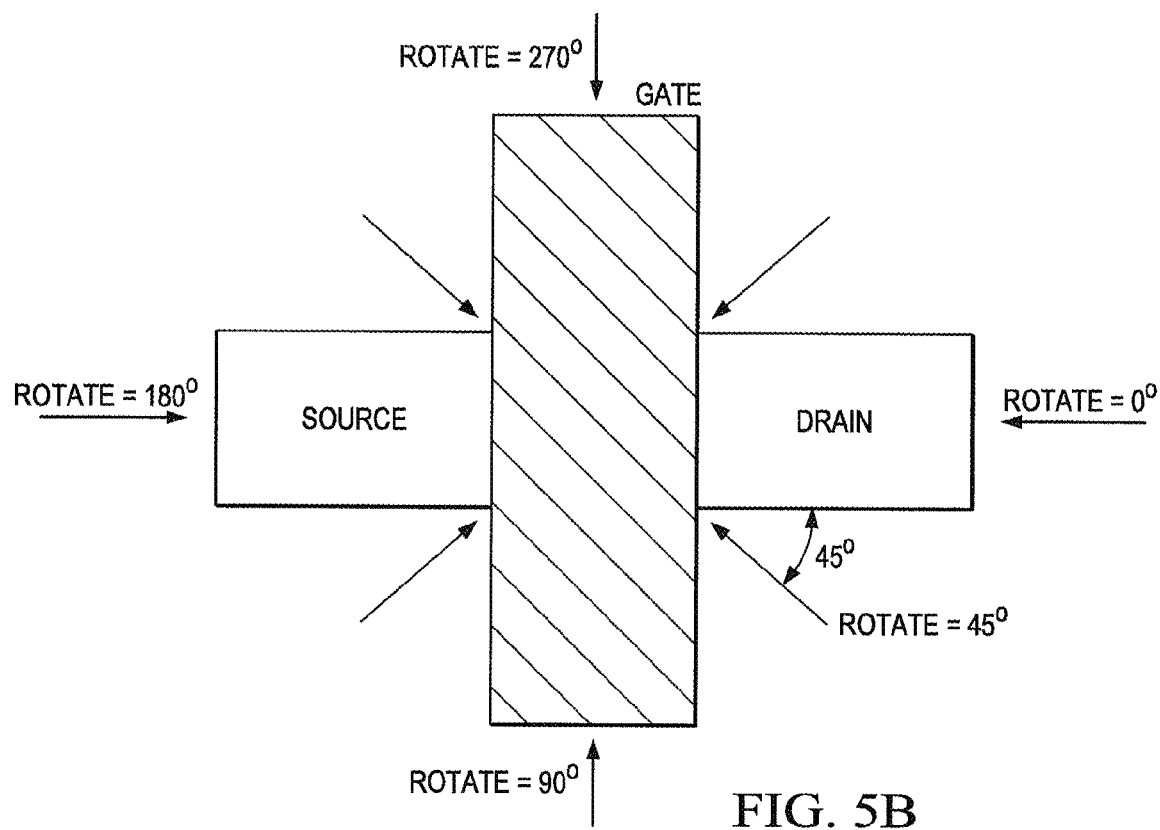

Turning to FIG. 5B, there is shown a top view of the conventional FET. Twist (or rotate) refers to the rotation angle as seen from a top view. As shown, and assuming zero degrees is on the right side (shown as Drain) of the Figure, the different rotational or twist angles are shown. In other words, a zero and 180 degree twist are perpendicular to the gate width, while the 90 and 270 degree twist are parallel to the gate width (or along the length of the width). As will be appreciated, when tilt equals 0 degrees, any and all twist angles have virtually no affect on the implantation profile.

Figure 6:
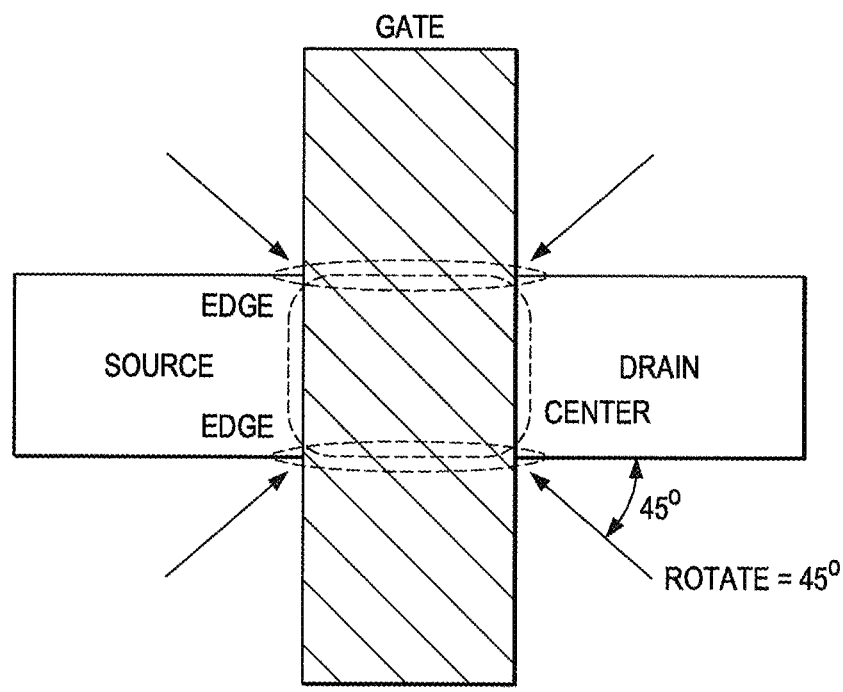
FIG. 6 is a top view of the FET illustrating the halo implantation process in accordance with the present disclosure.

Now turning to FIG. 6, there is provided a top view of the FET 200 illustrating the halo implantation process in accordance with the present disclosure. The halo region 280 is formed by a two-step process. In the first step, an intermediate halo region is formed using a conventional implantation technique with twist angle equal to substantially zero (it will be understood that this is the same as a twist angle of 90, 180 or 270 if the implant is quad or four directions) degrees and a tilt angle selected as desired. The desired tilt angle will depend on factors known to those skilled in the art. This first step forms a conventional halo region within the substrate 210 that is substantially uniform in profile along the gate width (i.e., same profile depth at the center and edge of the active region).

In the second step, the intended halo region 280 is formed using a conventional implantation technique but having a twist angle with respect to the gate width dimension. In one embodiment, the twist angle is about 45 degrees as measured in relation to the gate width (with reference to FIG. 5A, this means the dopants are implanted at 45, 135, 225 and 315 degrees). This can be done in four separate sub-steps (commonly referred to as a quad implant), or possibly in a single step (four implant sources). In another embodiment, the twist angle may be an angle between about 20 and 70 degrees as measured relative to the gate width. In other embodiments, the twist angle may be other angles, as desired. It will be appreciated that a tilt angle is also used at the same time as the twist angle. The angle of tilt may be the same or different as that used in the first step implantation process, and in one embodiment, is substantially the same.

Because the center portion of the FET 200 includes the raised S/D regions 250, 260 that partially block dopants during the halo implant, the halo region doping profile is shallower—as shown in FIG. 4B). At the edge of the S/D regions 250, 260, the dopants during the halo implant are not blocked by the raised silicon, and the dopants will implant through the channel surface and deeper into the substrate 210 resulting in the doping profile shown in FIG. 4C.

Figure 7:
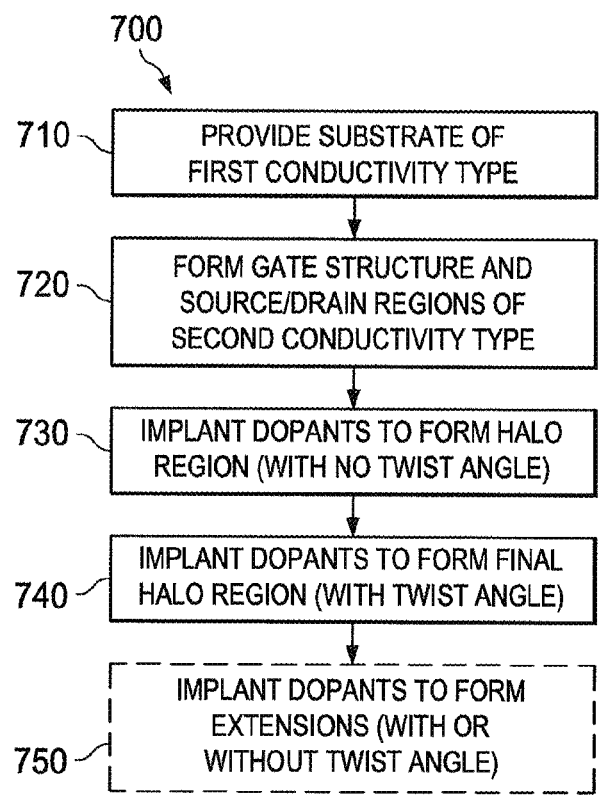
FIG. 7 illustrates a method or process of fabrication in accordance with the present disclosure.

Now referring to FIG. 7, there is shown a fabrication process 700 in accordance with this disclosure. The silicon substrate 210 of a first conductivity type is provided (at step 710). The raised source and drain region 250, 260 of a second conductivity type are formed in or on the substrate, and the gate structure 230 is formed and positioned such that a channel between the S/D regions 250, 260 is formed under the gate structure 230 (at a step 720). Typically the gate structure 230 is formed before the raised S/D regions 250, 260.

An intermediate halo region is formed within the substrate 210 by a first implantation of dopants having the first conductivity type (at a step 730). The first implantation is performed at a predetermined tilt angle and with a twist angle that has no substantial affect on the doping profile—such as approximately zero, 90, 180 or 270 degrees. As described above, this may be a single step (implantation performed in quad direction at 0/90/180/270 degrees) or separate sub-steps (implantation at each of 0, 90, 180 and 270 degrees).

The intended halo region 280 is formed within substrate 210 by a second implantation of dopants having the first conductivity type (at a step 740). The second implantation is performed at a twist angle and a tilt angle—as described hereinabove. This may include a single step (implantation performed in quad direction at 45/135/225/315 degrees) or separate sub-steps (implantation at each of 45, 135, 225 and 315 degrees).

In another embodiment, and as will appreciated, the second halo implant step could utilize dopants of the same conductivity type as the S/D regions. This method would enable a lower adjustment of Vt at edges of the active region, if desired.

Assuming S/D region extensions are desired, these extensions are formed by implantation of dopants having the second conductivity type and in accordance with known techniques (no twist angle) (at a step 750). Optionally, extensions can be implanted with a twist angle (such as that described earlier) at a given tilt angle to also decrease Vt at the edge portion if desired. Because the top up halo implant using a twist angle may slightly increase Vt at the center portion of the FET 200, in the event it is desired to maintain the original Vt at the center portion (as before the halo twist implant), then the first halo implant dose could be reduced.

Figure 8A:
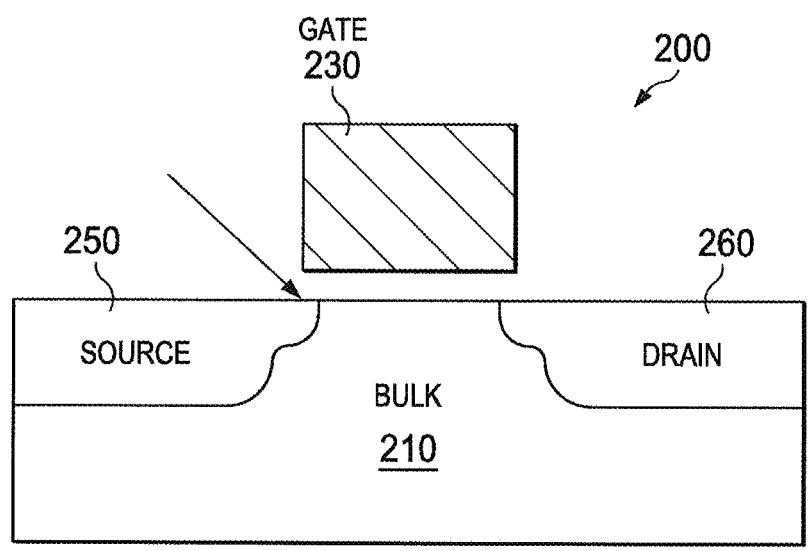
FIGS. 8A and 8B illustrate simulated halo region doping profile plots of a FET formed in accordance with process of the present disclosure.
Figure 8B:
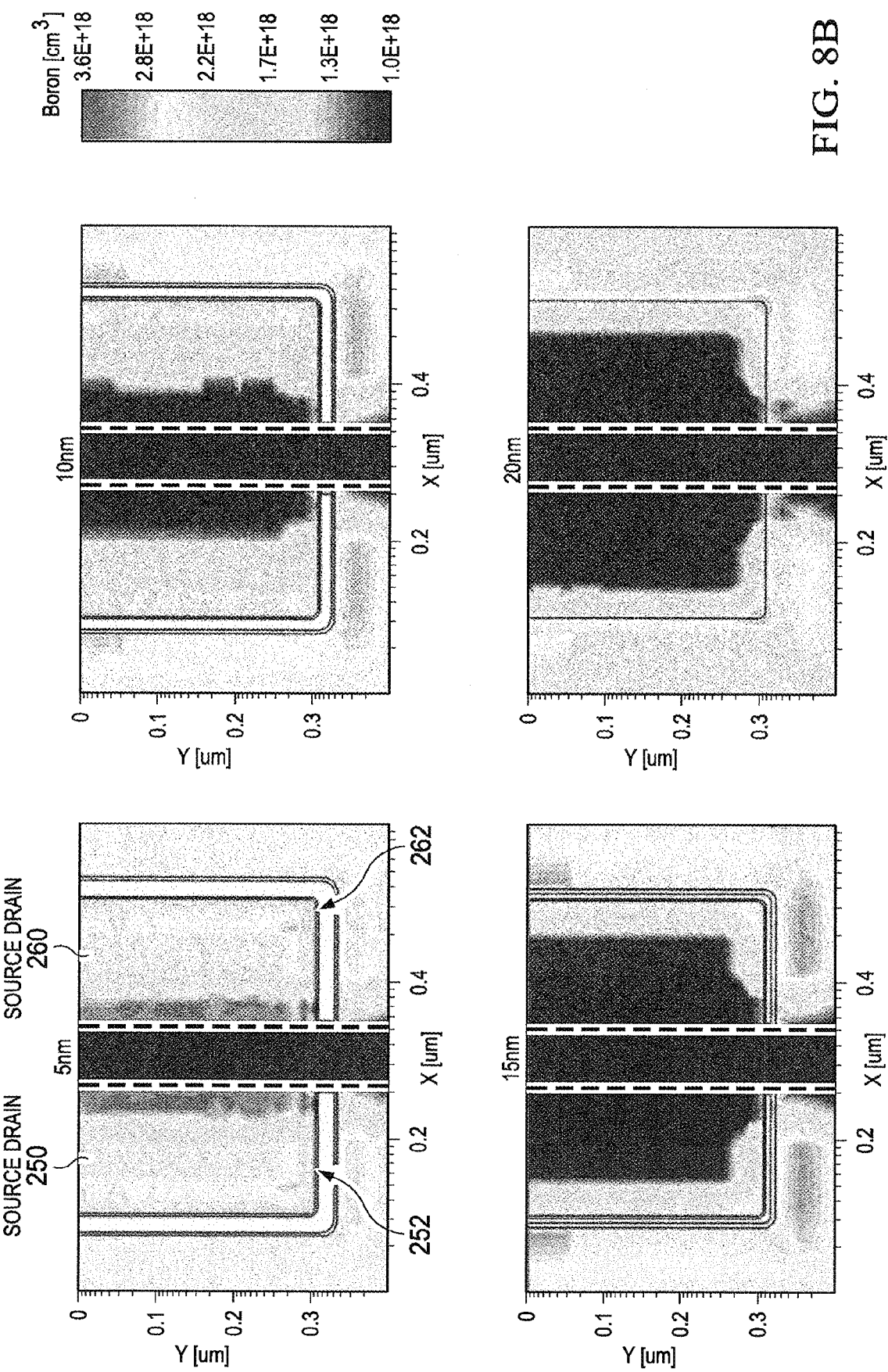

Now turning to FIGS. 8A and 8B, there are shown simulated halo region doping profile plots of the FET 200 formed in accordance with process of the present disclosure. For ease of reference, FIG. 8A illustrates a typical cross-sectional view of the FET 200. FIG. 8B includes four separate doping profile plots. The plots are shown at 5 nm, 10 nm, 15 nm and 20 nm depths from the channel surface. As can be seen, the doping profile/concentration near the center portion in the S/D regions 250, 260 is lower as the depth increases, while the doping profile/concentration is higher proximate the edge areas (252, 262) of the FET 200. As a result, the Vt of the FET 200 at the edge portion is increased. Thus, at a given depth (such as between about 5-20 nm), the doping concentration of the halo region 280b near the active edge 252, 262 is higher than the doping concentration of the halo region 280a near the center (substantially interior) of the S/D regions.

As will be appreciated, those skilled in the art will readily be able to determine suitable dopant dose and implant energy levels, which are technology dependent, to practice the teachings herein and achieve the results described.

The order of steps or processing can be changed or varied from that described above. It will be understood that well known process have not been described in detail and have been omitted for brevity. Although specific steps, insulating materials, conductive materials and apparatuses for depositing and etching these materials may have been described, the present disclosure may not limited to these specifics, and others may substituted as is well understood by those skilled in the art.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A field-effect transistor (FET) device comprising:
a substrate of a first conductivity type and defining a channel surface;
a gate structure having a dielectric layer and a gate electrode disposed on the substrate;
a first raised source/drain (S/D) region and a second raised S/D region having a channel formed beneath the gate structure, the first and second raised S/D regions of a second conductivity type;
a halo region having dopants of the first conductivity type and extending along at least a portion of the gate structure from one edge of the first raised S/D region to another edge of the first raised S/D region, the halo region comprising:
first dopants of the first conductivity type implanted within the substrate at a first predetermined tilt angle and at a first predetermined twist angle substantially equal to zero degrees relative to a direction perpendicular to the gate width, and
second dopants of the first conductivity type implanted at a second predetermined tilt angle and at a second predetermined twist angle of between about 20 and 70 degrees; and
wherein a doping concentration in the halo region near a center region of the first raised S/D region at a given depth below the channel surface is lower than a doping concentration in the halo region near an edge of the first raised S/D region at the given depth, such that the FET has a gate threshold (Vt) near the center region that is different than a Vt near the edge of the first raised S/D region.

2. The device in accordance with claim 1 wherein the FET has a gate threshold (Vt) near the center region that is lower than a Vt near the edge of the first raised S/D region.

3. The device in accordance with claim 1 wherein the first and second raised S/D regions each include an extension region of a second conductivity type and extending underneath the gate structure.

4. The device in accordance with claim 1 wherein the gate structure extends laterally beyond an edge of the first raised S/D region and an edge of the second raised S/D region.

5. The device in accordance with claim 1 wherein the first and second raised S/D regions are at least partially surrounded by a shallow trench isolation structure.

6. A semiconductor device, comprising:
a substrate of a first conductivity type;
a field effect transistor (FET) structure formed thereon and comprising a gate having a gate width, a first raised source/drain (S/D) region and a second raised S/D region, the first and second raised S/D regions of a second conductivity type;
a halo region having dopants of the first conductivity type disposed within the substrate, wherein the halo region comprises:
first dopants of the first conductivity type implanted at a first predetermined tilt angle and at a first predetermined twist angle substantially equal to zero degrees relative to a direction perpendicular to the gate width to form a first portion of the halo region, and
second dopants of the first conductivity type implanted at a second predetermined tilt angle and at a second predetermined twist angle to form a second portion of the halo region, such that a doping concentration at a given depth below a channel surface near a center of the first raised S/D region is lower than a doping concentration at the given depth below the channel surface near an edge of the first raised S/D region.

7. The device in accordance with claim 6 wherein the second predetermined twist angle is between about 20 and 70 degrees.

8. The device in accordance with claim 7 wherein the second predetermined twist angle is about 45 degrees.

9. The device in accordance with claim 6 wherein the first predetermined tilt angle is equal to the second predetermined tilt angle.

10. The device in accordance with claim 9 wherein the second predetermined twist angle is between about 20 and 70 degrees.

11. The device in accordance with claim 6 wherein the device has a gate threshold (Vt) near the center of the first raised S/D region that is lower than a Vt near the edge of the first raised S/D region.

12. The device in accordance with claim 6 wherein the first and second raised S/D regions each include an extension region of a second conductivity type and extending underneath the gate.

13. The device in accordance with claim 6 wherein the gate extends laterally beyond an edge of the first raised S/D region and an edge of the second raised S/D region.

14. The device in accordance with claim 6 wherein the first and second raised S/D regions are at least partially surrounded by a shallow trench isolation structure.

15. A field-effect transistor (FET) comprising:
a substrate of a first conductivity type;
a FET structure comprising a gate having a gate width, a first raised source/drain (S/D) region and a second raised S/D region, the first and second raised S/D regions of a second conductivity type; and
a halo region disposed in the substrate and having dopants of the first conductivity type, the halo region comprising:
first dopants of the first conductivity type implanted within the substrate at a first predetermined tilt angle and at a first predetermined twist angle substantially equal to zero degrees relative to a direction perpendicular to the gate width, and
second dopants of the first conductivity type implanted at a second predetermined tilt angle and at a second predetermined twist angle of between about 20 and 70 degrees.

16. The FET in accordance with claim 15 wherein a doping concentration at a predetermined depth below a channel surface near a center of the first raised S/D region is lower than a doping concentration at the predetermined depth near an edge of the first raised S/D region.

17. The FET in accordance with claim 15 wherein the second predetermined twist angle is about 45 degrees, and the first predetermined tilt angle is equal to the second predetermined tilt angle.

18. The FET in accordance with claim 15 wherein the raised S/D regions are at least partially surrounded by a shallow trench isolation structure.

19. The FET in accordance with claim 15 wherein the device has a gate threshold (Vt) near a center of the first raised S/D region that is lower than a Vt near the edge of the first raised S/D region.

20. The FET in accordance with claim 19 wherein:
- the first and second raised S/D regions each include an extension region of a second conductivity type and extending underneath the gate; and
- the gate extends laterally beyond an edge of the first raised S/D region and an edge of the second raised S/D region.

\* \* \* \* \*